United States Patent [19]

Bhargava

[11] Patent Number: 4,716,499
[45] Date of Patent: Dec. 29, 1987

[54] ENCLOSED CIRCUIT BOARD ASSEMBLY

[75] Inventor: Vikram Bhargava, Alpharetta, Ga.

[73] Assignee: Hayes Microcomputer Products, Inc., Norcross, Ga.

[21] Appl. No.: 889,739

[22] Filed: Jul. 28, 1986

[51] Int. Cl.$^4$ .............................................. H05K 7/12
[52] U.S. Cl. ..................................... 361/395; 220/4 B; 174/52 R; 361/383; 361/424
[58] Field of Search ...................... 220/4 B; 174/52 R; 211/41; 361/380, 395, 399, 382, 383, 427, 422, 424, 412, 415

[56] References Cited

U.S. PATENT DOCUMENTS

| | | | |
|---|---|---|---|
| 3,668,476 | 6/1972 | Wrabel | 361/395 |
| 3,693,410 | 9/1972 | Robrecht | 220/4 B |
| 4,149,027 | 4/1979 | Asher | 361/399 |
| 4,295,179 | 10/1981 | Read | 220/4 B |
| 4,409,641 | 10/1983 | Jakob | 361/399 |
| 4,447,856 | 5/1984 | Takahashi | 361/383 |

FOREIGN PATENT DOCUMENTS

| | | | |
|---|---|---|---|
| 598078 | 9/1959 | Italy | 220/4 B |
| 44011 | 3/1960 | Poland | 361/399 |

OTHER PUBLICATIONS

IBM Tech. Discl. Bull., vol. 21, No. 11, Apr. 1979, pp. 4487, Power Feeder Housing, Arnold.

Primary Examiner—G. P. Tolin
Attorney, Agent, or Firm—Jones, Askew & Lunsford

[57] ABSTRACT

An enclosed circuit board assembly is provided which includes two mating enclosure members mounted to a circuit board and to each other, which combine to isolate the circuit board from contact with stray wires, human fingers, other undesirable foreign objects. The assembly is sufficiently ventilated to allow effective cooling of the circuit board by natural convection and/or forced convection, and includes a plurality of locking fingers which attach to the circuit board. A plurality of pry holes are provided to provide an effective means of removing the assembly when mounted between similar assemblies.

9 Claims, 3 Drawing Figures

ENCLOSED CIRCUIT BOARD ASSEMBLY

TECHNICAL FIELD

The present invention generally relates to enclosures for electronic circuit boards, and particularly to a protective covering for such boards which effectively isolates the circuit board within a computer, is sufficiently ventilated to allow effective cooling of the circuit board by natural convection and/or forced convection, and provides an effective means of removing the circuit board and covering when mounted between similar assemblies.

BACKGROUND OF THE INVENTION

In computer operation, especially personal computer operation, it is often desirable to provide modems which allow a computer to send and receive data across conventional telephone lines. As known in the art, and to most users of computers, modems (a contraction for modulator/demodulator) are devices which convert digital signals from a computer or terminal into a modulated signal appropriate for transmission across conventional telephone lines. Most modems for personal computer use a modulation technique which is appropriate for transmission over the relatively narrow usable bandwidth of conventional phone lines.

Many personal computers in use today have a hardware architecture by which peripheral devices are connected to expansion slots on the mother board of the computer, as opposed to serial or parallel ports with plug connections which are external to the computer cover. A number of peripherals or expansion devices may be inserted into the expansion slots and the normal cover for the computer can be replaced. This arrangement allows the user to expand the capabilities of the computer without a corresponding expansion of the number of boxes and cables lying about at the computer installation site.

In the marketing of personal computers, a trade-off is often necessary between the physical size of the computer and the number of expansion slots made available to the user. Therefore, inter-slot spacing in such computers is kept to a practical minimum. Modems and other devices constructed upon a single circuit board which occupy only a single expansion slot of a small computer are desired by users.

As previously discussed, modems provide an interface between the computers a telephone network. However, telephone networks typically operate on a relatively low voltage (48 volts) compared to the operating voltage supplied to the computers (120-240 volts). Therefore it is imperative that the computer supply voltage be sufficiently isolated from the telephone network, in order to avoid damage to the telephone network. Consequently, various regulation schemes have been propagated to control the design and manufacture of modems.

One such regulation scheme is that promulgated by the British Board of Telecommunications (BABT), in the United Kingdom. This scheme requires that modems designed for connection to the phone network be enclosed by a cover having restricted vent hole sizes. Although it is probable that such a scheme was intended only for modems external to the computer, or "stand-alone" modems, nevertheless the scheme has been interpreted to apply to internal modems.

The BABT regulations require the above-referenced type of housing to enclose the telephone line interface portion of the circuit in question. However, the inventors of the present invention have found it is preferable, although not necessary, to provide an enclosure for the complete circuit board. This allows the modem designer to subsequently alter the layout of components on the computer side and telco side of the telephone line interface without requiring redesign of the bureaucratically required enclosure.

As referenced above, typical small computers with expansion slot architecture have predetermined inter-slot spacing which is as narrow as practically possible. Most typical circuit boards are of relatively small thickness with repect to the available inter-slot spacing. Therefore, users of such computers can normally extract circuit boards inserted into expansion slots by gripping portions of the relatively thin circuit board and pulling them upward. Expansion slot connectors generally require significant insertion force to insert the board, and therefore grip the inserted board rather tightly. This is done in order to insure the integrity of the electrical contacts at the circuit board/interface slot connection. However, once a significant portion of the board is encased in a plastic housing, two problems arise with respect to removal of the circuit board. The first is the fact that most plastics exhibit a rather low coefficient of friction with human fingers, and thus it is difficult to grip the plastic housing with sufficient force to pull the circuit board/enclosure assembly out of the slot. Secondly, use of a plastic enclosure over the board will normally (as it does in the case of the preferred embodiment of the present invention) cause the board/enclosure assembly to occupy almost the entire available inter-slot spacing. Therefore, even if the above-noted problem with friction could be overcome by the user, it is difficult to lower one's fingers on the surface of the enclosure sufficiently to get a good grip on the board to extract it in situations where adjacent expansion slots are also occupied.

Therefore it may be seen that a need has existed for a compact modem circuit board enclosure which satisfies the aforementioned regulations, is configured to be readily inserted and removed from a standard expansion standard slot within a computer, and provides adequate ventilation for the circuit board.

SUMMARY OF THE INVENTION

The present invention solves problems in the prior art in that it provides a compact modem circuit board enclosure which satisfies regulations such as those promulgated by the BABT in the United Kingdom, is configured to be readily inserted and removed from a standard expansion slot within a computer, and provides adequate ventilation for the circuit board.

The device in general includes an improved protective enclosure for enclosing an electrical circuit board, comprising, a first cover including a first engagement means for engaging an edge of the circuit board, a second cover including a second engagement means for engaging an edge of the circuit board, such that when the first and second circuit board engagement means each engage the circuit board, the first and second cover means combine to enclose the circuit board.

Stated somewhat more particularly, the first and second engagement means of the device each include at least one selectively detachable locking finger.

By providing the above generally described structure, the present invention overcomes the above-noted problems which arise from the somewhat irrational application of the BABT enclosure regulations for devices which interface to the telephone line. Such regulations make perfect sense when applied to stand-alone external devices. However, the application of the regulations to the environment of a modem for plugging into an expansion slot, which is completely enclosed within the normal case or housing of a computer during normal use, has led to the design problems described in the background of the invention. By providing the above-described pry cavity, the user has an available portion of the enclosure to grip when the modem must be removed from the computer, and yet the lateral extent of the structure is limited to the space available for a board occupying a single expansion slot.

It is an object of the invention to provide an enclosed circuit board assembly.

It is a further object of the present invention to provide such a assembly which may be readily installed into and removed from a standard expansion slot within a computer.

It is a further object of the present invention to provide such a assembly which allows sufficient ventilation of the enclosed circuit board.

It is a further object of the present invention to provide such a assembly which is readily and easily assembled.

Other objects, features and advantages of the present invention will become apparent upon reading the following detailed description in conjunction with the drawings and the claims.

DESCRIPTION OF THE DISCLOSED EMBODIMENTS

Figure 1:
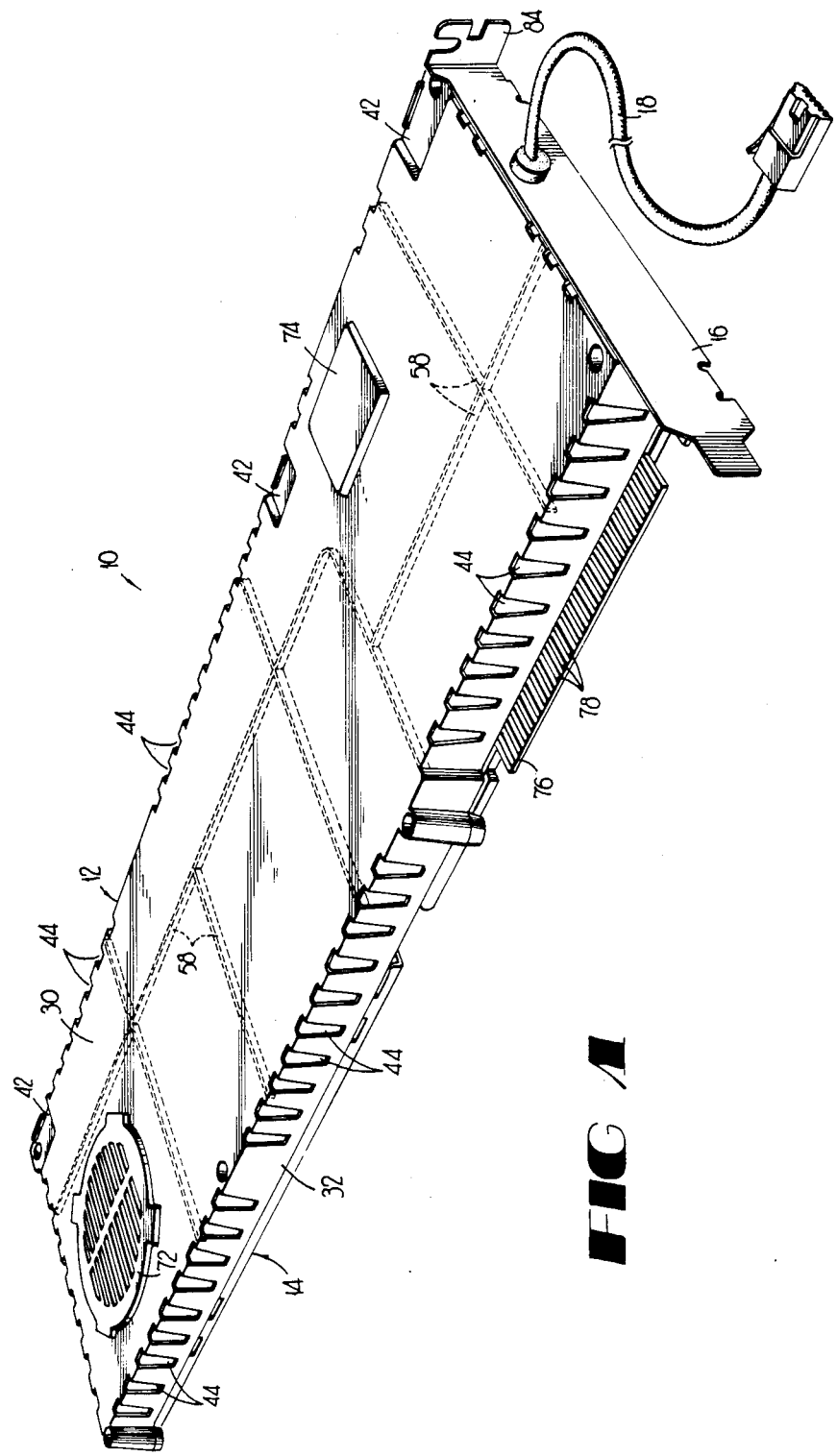
FIG. 1 is a pictorial illustration of the enclosed circuit board assembly of the present invention.
Figure 2:
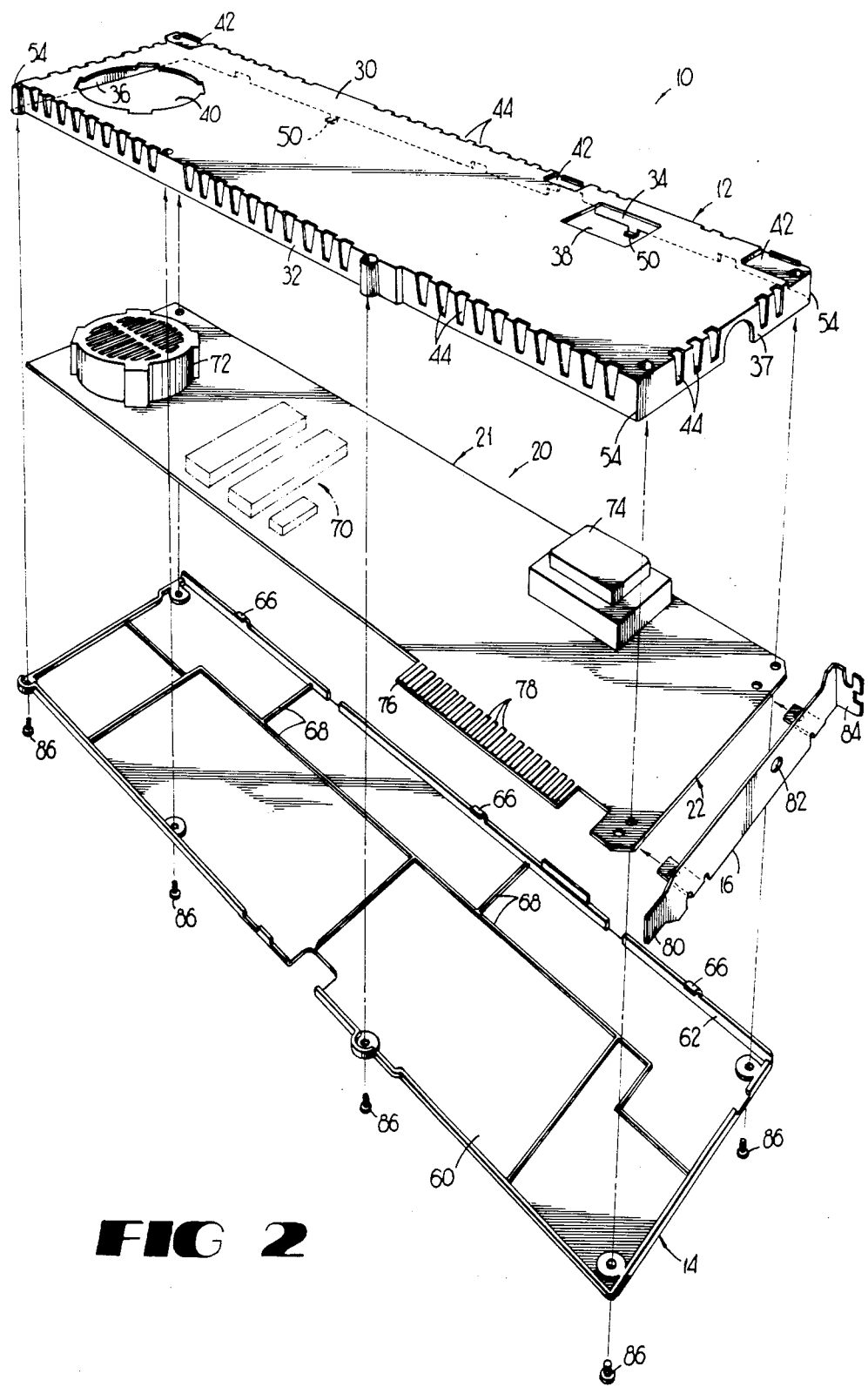
FIG. 2 is an exploded view of the enclosed circuit board assembly of FIG. 1.

Referring now in more detail to the drawings, in which like numerals indicate like parts throughout the several views, FIG. 1 shows an assembled enclosed circuit board assembly 10 including a component side enclosure member 12, a foil side enclosure member 14, a circuit board (not shown in FIG. 1) a mounting bracket 16, and an external connecting cord 18. Referring now to FIG. 2, it may be seen that the component side enclosure member 12 encloses the side of the circuit board 20 which supports various electronic components, such as transformers, resistors, microprocessors, diodes, capacitors, etc. Similarly, the foil side enclosure member 14 encloses the side of the circuit board 20 which supports a plurality of traces of conductive metal (not shown), which connect pins and component leads extending through the circuit board from the electronic components to electronically interconnect the circuit components. Therefore it may be seen that the component side and foil side enclosure members 12, 14, combine to substantially enclose the circuit board 20.

Figure 3:
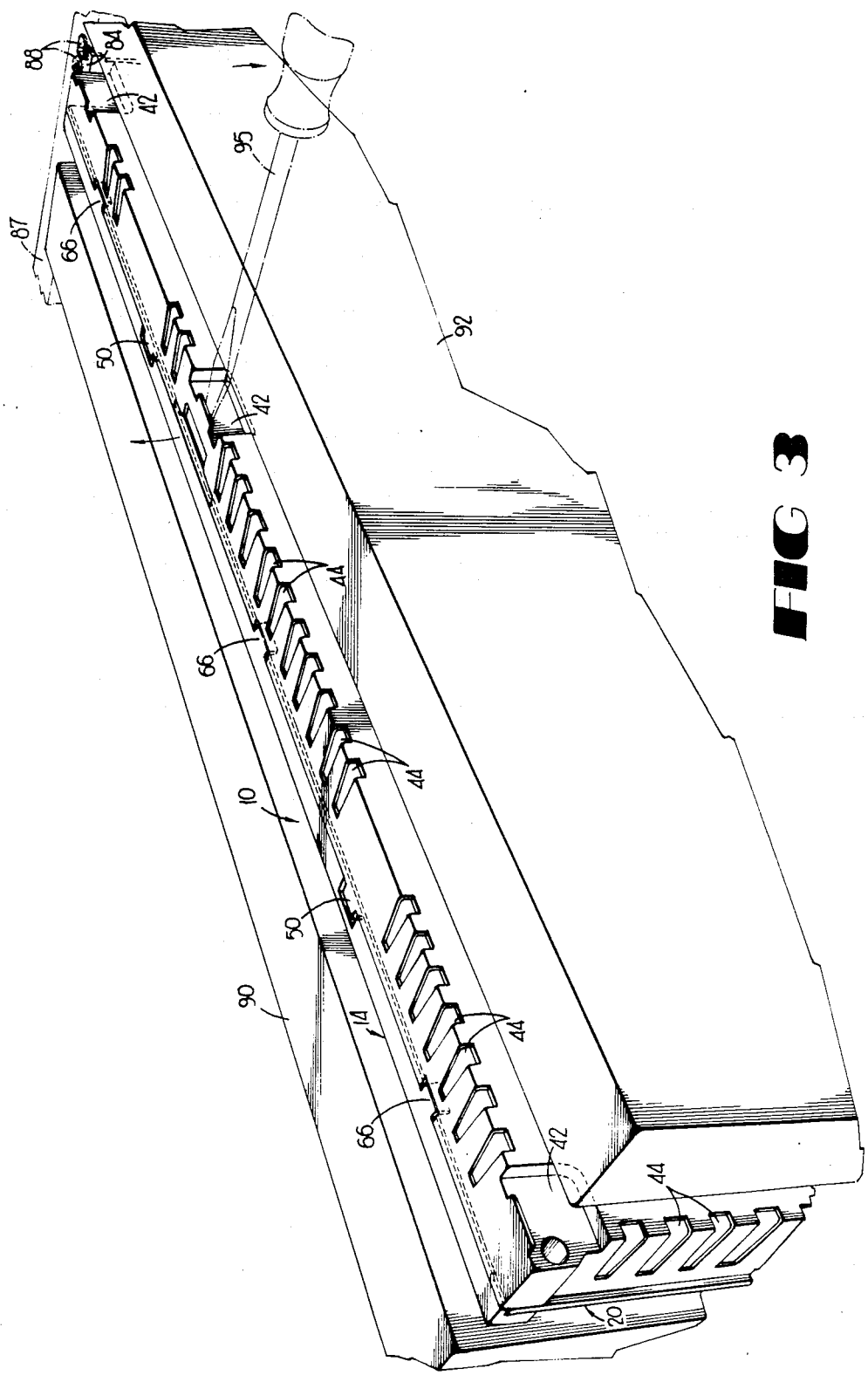
FIG. 3 is a partial pictorial illustration of the enclosed circuit board assembly in an installed position between two typical enclosures.

It should be understood the enclosed circuit board assembly 10 is typically mounted within personal computers such as those manufactured by International Business Machines. When so mounted, the enclosed circuit board assembly 10 is typically mounted as shown in FIG. 3, with the primary planar surfaces of the circuit board being vertical.

Referring now to FIG. 2, the component side enclosure member 12 includes a cover plate 30, a lower wall 32, an upper wall 34, and end walls 36, 37. The cover plate 30 defines a transformer hole 38, a speaker hole 40, and pry slots 42. The lower wall 32 extends away at a right angle from the lower edge of the the the cover plate 30 and defines a plurality of ventilation slots 44.

The upper wall 34 extends away from the upper edge of the cover plate 30 at a right angle and is substantially parallel to the lower wall 32. The upper wall 34 defines a plurality of ventilation slots (not shown), and includes two locking fingers 50 extending at right angles to the upper wall and parallel to the cover plate 30. As discussed in further detail later in this description, the locking fingers 50 are configured to lock to the circuit board 20 and maintain a relatively rigid but detachable connection between the component side enclosure member 12 and the circuit board.

The end walls 36, 37, of the component side enclosure member 12 extend away at right angles from the end edges of the cover plate 30, and also intersect the upper and lower walls 32, 34, to form four corner edges 54 of the component side enclosure member 12. The end walls 36, 37, also define a plurality of ventilation slots 44.

Referring now to FIG. 1, reinforcement ribs 58 are provided on the circuit board side of the cover plate 30, and provide increased rigidity to the component side enclosure member 12.

Referring now to FIG. 2, the foil side enclosure member 14 includes a lower plate 60, and an upper wall 62 extending at a right angle from the upper edge of the lower plate. Three locking fingers 66 extend at right angles from the upper edge of the lower plate 60, and are configured to lock to the circuit board 20 and maintain a relatively rigid but detachable connection between the foil side enclosure member 14 and the circuit board. Ribs 68 are provided in the lower plate 60 to provide increased rigidity to the foil side enclosure member 14.

The circuit board 20 is substantially planar, has an upper edge 21, a bracketed edge 22, and supports the previously-discussed electronic components, denoted generally as 70, and particularly including a speaker 72, and a transformer 74. The circuit board 20 also includes a mounting tab 76 including a plurality of contact pads 78, which are electrically linked to the electronic components 70. As discussed later in this description, when the enclosed circuit board enclosure 10 is installed into a computer (not shown), the contact pads 78 contact cooperating contact brushes (not shown) in the computer, thus providing an operable connection between the computer and the electronic components 70 on the circuit board 20.

The mounting bracket 16 is platelike, and includes a guide tab 80, a cord hole 82, and a slotted flange 84, which extends at a right angle from the mounting bracket.

Referring now to FIG. 1, the connecting cord 18 extends through the cord hole 82 in the mounting bracket 16, and allows for connection of the electronic device within the circuit board enclosure to a device external to the personal computer, such as a phone line, hard disk drive, or printer. In the preferred embodiment, the connecting cord is connected to a telephone subscriber line.

Assembly of the enclosed circuit board assembly 10 is now discussed. The mounting bracket 16 is fastened to the circuit board 20 by riveting or other fastening means known in the art, such that the mounting bracket extends along the bracketed edge 22 of the circuit board, and such that the primary planar surfaces of the mounting bracket are substantially perpendicular to the primary planar surfaces of the circuit board.

The component side enclosure member 12 is placed on the circuit board 20 such that the component side of the circuit board is substantially concealed, the speaker 72 and the transformer 74 extend through the speaker hole and transformer hole 40, 38, respectively, and the locking fingers 50 engage the upper edge 21 of the circuit board. The foil side enclosure member 14 is placed on the circuit board such that the foil side of the circuit board 20 is concealed, and the locking fingers 66 engage the upper edge 21 if the circuit board. The screw holes in the component side enclosure 12, the circuit board 20, and the foil side enclosure 14 are then placed in alignment such that screws 86 may be installed.

When the enclosed circuit board assembly 10 is fully assembled, the mounting bracket 16 is outside and adjacent to end wall 37, and the mounting tab 76 extends from the bottom of the enclosed circuit board assembly. FIG. 3 shows the particular interlocking relationship of the locking fingers 50, 66, of the assembled enclosed circuit board assembly 10. The locking fingers 50 extend from the upper wall 34 of the component side enclosure member 12, and grasp the upper edge 21 of the circuit board. Similarly, the locking fingers 66 extend from the upper wall 62 of the foil side enclosure member 14, and similarly grasp the upper edge 21 of the circuit board 20, but from the opposite side than the locking fingers 50. Therefore it may be seen that the locking fingers 50, 66, of the component side enclosure member and the foil side enclosure member 12, 14, respectively, combine to grasp the upper edge 21 of the circuit board 20, and maintain the upper edge 21 in a spaced-apart relationship between the enclosure members 12, 14.

Installation of the enclosed circuit board assembly is now discussed. Referring now to FIG. 3, the enclosed circuit board assembly 10 is installed in a computer (not shown) such that the mounting tab 76 fits within a corresponding slot (not shown) in the computer and the contact pads 78 on the mounting tab are in contact with contact brushes (not shown) in the computer to allow cooperation between the computer and the circuit board as previously discussed. The guide tab 80 of the mounting bracket fits within a corresponding anchoring slot (not shown) defined by the frame of the computer for additional stability. When the enclosed circuit board assembly 10 is in position, the slotted flange 84 of the mounting bracket 16 is rigidly secured to the a frame member 87 (shown in phantom) of the computer by means of screws 88.

As space within computers is normally at a premium, it is common to mount such circuit boards in a "sandwiched" relationship, such that the planar surfaces of the circuit boards are substantially parallel. FIG. 3 shows a typical sandwiched mounting configuration of the enclosed circuit board assembly 10 between two typical devices 90, 92. Devices 90 and 92 are shown in block form in FIG. 3 to generally represent the lateral space occupied by adjacent circuit boards in a typical environment of the preferred embodiment. It should be understood that normally devices 90 and 92 will be physically embodied by circuit boards populated with electronic components as very few computer systems will have more than one modem or other telco connected device embodying the present invention installed.

It may be seen that this compact mounting configuration could present problems in removing the enclosed circuit board assembly from within the enclosures 90, 92. However, the pry slots 42 provided in the component side enclosure provide an effective means of prying the enclosed circuit board assembly from within the other circuit board enclosures. A screwdriver 95 (shown in phantom), or other similar prying tool may be used to engage the pry holes 42, to force the enclosed circuit board assembly 10 from its mounted position.

When the enclosed circuit board assembly is installed, the ventilation slots 44 in the enclosed circuit board assembly 10 are positioned such that air may flow through the enclosed circuit board assembly through natural convection and/or forced convection, so that there is minimal risk of overheating of the circuit board during operation. However, these slots are small enough to prevent stray wires human fingers, etc, from contacting components within the enclosure. The size of the ventilation slots 44 is often dictated by applicable safety codes or regulations. In the preferred embodiment of the present invention, which is particularly suited for applications in the United Kingdom, the width of the slots is 0.125", and the length is 0.325". However, it should be understood that other slot configurations or dimensions may be utilized while remaining within the spirit and scope of the present invention.

Therefore it may be seen that the present invention provides an effective circuit board enclosure which effectively isolates the circuit board within a computer, is sufficiently ventilated to allow effective cooling of the circuit board by natural convection and/or forced convection, and may be easily removed when mounted between similar enclosures.

It should be understood that the foregoing related only to a preferred embodiment of the present invention, and that numerous modifications or alterations may be made therein without departing from the spirit and scope of the present invention as set forth in the appended claims.

While the invention has been described in detail with particular reference to the disclosed embodiments, it will be understood that variations and modifications can be effected within the spirit and scope of the invention as defined by the appended claims.

What is claimed is:

1. An improved protective enclosure enclosing an electrical circuit board having a first and a second side, comprising:
    a first cover at least partially concealing the first side and including a first engagement means extending over an edge of said circuit board, and engaging said second side;
    a second cover at least partially concealing said second side and including a second engagement means extending over an edge of said circuit board and engaging said first side, such that said first cover and said second cover means combine to at least partially enclose said circuit board.

2. The protective enclosure of claim 1, wherein said first and second engagement means extend over a common edge of said circuit board.

3. The protective enclosure of claim 2, wherein at least one of said first and second engagement means is selectively detachable from said circuit board.

4. The protective enclosure of claim 3, wherein said first and second engagement means include at least one locking finger extending from said first cover and said second cover, respectively.

5. The protective enclosure of claim 1, wherein at least one of first and second engagement means is selectively detachable from said circuit board.

6. The protective enclosure of claim 1, wherein said first and second engagement means include at least one locking finger extending from said first and said second cover, respectively.

7. The protective enclosure of claim 2, wherein said first and said second engagement means include at least one locking finger extending from said first and said second cover, respectively.

8. The improved protective enclosure of claim 7, wherein said first cover encloses a first side of said circuit board, wherein said second cover encloses a second side of said circuit board, wherein said locking finger extending from said first cover extends over said common edge of said circuit board to bias against said second side of said circuit board, and wherein said locking finger extending from said second cover extends over said common edge of said circuit board to bias against said first side of said circuit board.

9. The improved protective enclosure of claim 6, wherein said first cover encloses a first side of said circuit board, wherein said second cover encloses a second side of said circuit board, wherein said locking finger extending from said first cover extends over an edge of said circuit board to bias against said second side of said circuit board, and wherein said locking finger extending from said second cover extends over an edge of said circuit board to bias against said first side of said circuit board.

* * * * *